(12) United States Patent
Jiang et al.

(10) Patent No.: US 8,815,728 B2
(45) Date of Patent: Aug. 26, 2014

(54) SEMICONDUCTOR DEVICE HAVING METAL ALLOY GATE AND METHOD FOR MANUFACTURING THE SAME

(75) Inventors: Li Jiang, Shanghai (CN); Mingqi Li, Shanghai (CN); Pulei Zhu, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 13 days.

(21) Appl. No.: 13/486,994

(22) Filed: Jun. 1, 2012

(65) Prior Publication Data

US 2013/0105919 A1 May 2, 2013

(30) Foreign Application Priority Data

Jun. 2, 2011 (CN) .......................... 2011 1 0146824

(51) Int. Cl.
*H01L 21/3205* (2006.01)

(52) U.S. Cl.
USPC ........... 438/592; 438/643; 438/652; 438/658; 438/660; 257/E21.643

(58) Field of Classification Search
USPC ................ 438/643, 652, 658, 660, 692, 592; 257/E21.584

See application file for complete search history.

(56) References Cited

U.S. PATENT DOCUMENTS

| 7,795,097 | B2* | 9/2010 | Pas ................................ 438/278 |
| 2005/0051854 | A1* | 3/2005 | Cabral et al. .................. 257/407 |
| 2007/0037343 | A1* | 2/2007 | Colombo et al. ............. 438/231 |
| 2010/0059823 | A1* | 3/2010 | Chung et al. ................... 257/355 |
| 2010/0193872 | A1* | 8/2010 | Carter et al. .................. 257/368 |
| 2011/0195550 | A1* | 8/2011 | Chang et al. .................. 438/230 |
| 2011/0195569 | A1* | 8/2011 | Moon et al. ................... 438/643 |
| 2011/0195570 | A1* | 8/2011 | Lin et al. ....................... 438/652 |
| 2011/0198699 | A1* | 8/2011 | Hung et al. ................... 257/369 |
| 2011/0215409 | A1* | 9/2011 | Li et al. ......................... 257/351 |
| 2012/0248550 | A1* | 10/2012 | Huang et al. .................. 257/410 |

* cited by examiner

*Primary Examiner* — Thanh V Pham
(74) *Attorney, Agent, or Firm* — Innovation Counsel LLP

(57) ABSTRACT

A semiconductor device and a method for manufacturing the semiconductor device are provided. The semiconductor device uses an aluminum alloy, rather than aluminum, for a metal gate. Therefore, the surface of the high-k metal gate after the CMP is aluminum alloy rather than pure aluminum, which can greatly reduce defects, such as corrosion, pits and damage, in the metal gate and improve reliability of the semiconductor device.

11 Claims, 7 Drawing Sheets

SEMICONDUCTOR DEVICE HAVING METAL ALLOY GATE AND METHOD FOR MANUFACTURING THE SAME

CROSS-REFERENCES TO RELATED APPLICATIONS

This application claims priority to Chinese Patent Application No. CN201110146824.6, filed on Jun. 2, 2011, which is incorporated herein by reference in its entirety.

BACKGROUND OF THE INVENTION

1. Field of the Disclosure

The present disclosure relates to semiconductor device and method for manufacturing the same, in particular, to a semiconductor device using aluminum alloy as its metal gate and a method for manufacturing the same.

2. Description of the Related Art

As dimensions of semiconductor devices are continuously shrinking, the size of the gate structure and the thickness of the gate insulating layer are correspondingly decreased. However, the leakage current may become excessively large when the gate silicon oxide insulating layer is too thin. To reduce the leakage current, a high-dielectric-constant (high-k) material, rather than silicon oxide, is used for the gate insulating layer. However, a polysilicon gate may react with the high-k material, resulting in issues like gate depletion effect and boron penetration problem, which can degrade the device performance. Therefore, metal materials are used for gates to replace polysilicon.

High-k metal gates have become a mainstream solution. Usually, the metal gates are formed of aluminum. In the processes of making an aluminum gate, chemical mechanical polishing (CMP) for planarizing the aluminum gate is very critical. However, as aluminum is an active metal, during the CMP and subsequent cleaning processes, it is prone to corrosion in acid or alkali environments. If aluminum corrosion such as pits occurs on aluminum gates, device performance and reliability can be greatly degraded.

BRIEF SUMMARY OF THE INVENTION

One object of the present disclosure is to manufacture a semiconductor device with improved reliability.

According to a first aspect of the present disclosure, a semiconductor device comprises a semiconductor substrate; a gate insulating layer over the substrate, the gate insulating layer having a high dielectric constant (e.g., >10), a first barrier layer disposed on the gate insulating layer, and a gate formed of an aluminum alloy disposed on the first barrier layer.

Preferably, the semiconductor device further comprises a work function metal layer disposed on the first barrier layer, wherein the aluminum alloy gate is located over the work function metal layer.

Preferably, the semiconductor device further comprises a second barrier layer disposed between the work function metal layer and the aluminum alloy gate. More preferably, the work function metal layer is a TiAl alloy layer of 40 Å to 120 Å thick, and the second barrier layer is a TiN barrier layer of 10 Å to 50 Å thick.

Preferably, the gate insulating layer is a hafnium oxide layer of 10 Å to 30 Å thick.

Preferably, the first barrier layer comprises a stack of a TiN layer of 10 Å to 50 Å thick and a TaN layer of 5 Å to 15 Å thick.

Preferably, the aluminum alloy in the gate is an AlTi alloy.

Preferably, the height from the top surface of the gate insulating layer to the top surface of the aluminum alloy gate is 300 Å to 400 Å.

Preferably, the AlTi alloy is 250 Å to 300 Å thick.

According to a second aspect of the present disclosure, a method for manufacturing a semiconductor device comprises forming a substrate, forming an interlayer dielectric layer over the substrate and a dummy gate embedded in the interlayer dielectric layer on a substrate, and removing the dummy gate to form a recess in the interlayer dielectric layer. The method further comprises depositing a gate insulating layer having a high dielectric constant (e.g., greater than 10) over the interlayer dielectric layer and the substrate, depositing a first barrier layer on the gate insulating layer; depositing a first metal layer on the first barrier layer, depositing a second metal layer on the first metal layer, and performing annealing to melt the upper portion of the first metal layer and the lower portion of the second metal layer into an alloy. In addition, the method also comprises performing chemical mechanical polishing until the interlayer dielectric layer and the alloy are exposed.

Preferably, the first metal layer comprises titanium, indium, or gallium.

Preferably, the second metal layer comprises aluminum or tungsten.

Preferably, the method further comprises the following step after the step of depositing the first barrier layer and before the step of depositing the first metal layer: depositing a work function metal layer on the first barrier layer.

Preferably, the method further comprises the following step after the step of depositing the work function metal layer and before the step of depositing the first metal layer: depositing a second barrier layer on the work function metal layer. More preferably, the work function metal layer is a TiAl alloy layer of 40 Å to 120 Å thick, and the second barrier layer is a TiN barrier layer of 10 Å to 50 Å thick.

Preferably, the gate insulating layer is a hafnium oxide layer of 10 Å to 30 Å thick.

Preferably, the step of depositing a first barrier layer comprises: depositing a TiN layer of 10 Å to 50 Å thick and sequentially depositing a TaN layer of 5 Å to 15 Å thick on the TiN layer.

Preferably, the annealing is performed at a temperature from 300° C. to 460° C.

Preferably, the alloy is AlTi alloy.

Preferably, the thickness of the AlTi alloy after chemical mechanical polishing is 250 Å to 300 Å.

An advantage of the present disclosure is in that, by using an aluminum alloy as the metal gate, defects in the metal gate can be greatly reduced, and therefore the reliability of the semiconductor device is improved.

Further features of the present disclosure and advantages thereof will become apparent from the following detailed description of exemplary embodiments according to the present disclosure with reference to the attached drawings.

BRIEF DESCRIPTION OF THE DRAWINGS

The present disclosure will be more clearly understood from the following detailed description with reference to accompanying drawings. In the attached drawings, various parts are not always drawn in actual proportion for the convenience of description. In the drawings.

DETAILED DESCRIPTION OF THE INVENTION

To solve the current problems described above, the inventors of the present disclosure have found that an aluminum alloy is more resistant to chemical corrosion and mechanical damage. Particularly, AlTi alloy is more resistant to corrosion and mechanical damage as compared with an aluminum film. If the post-CMP surface of the high-k metal gate contains an aluminum alloy instead of pure aluminum, defects such as corrosive pit damage in the metal gate can be greatly reduced. Furthermore, it does not affect the electrical properties of the metal gate.

Various exemplary embodiments of the present disclosure will be described in detail with reference to the drawings.

The following description of exemplary embodiments is merely illustrative and is in no way intended to limit the disclosure, its application, or uses. Techniques well known in the art can be applied to the parts that are not specifically illustrated or described.

Figure 4:
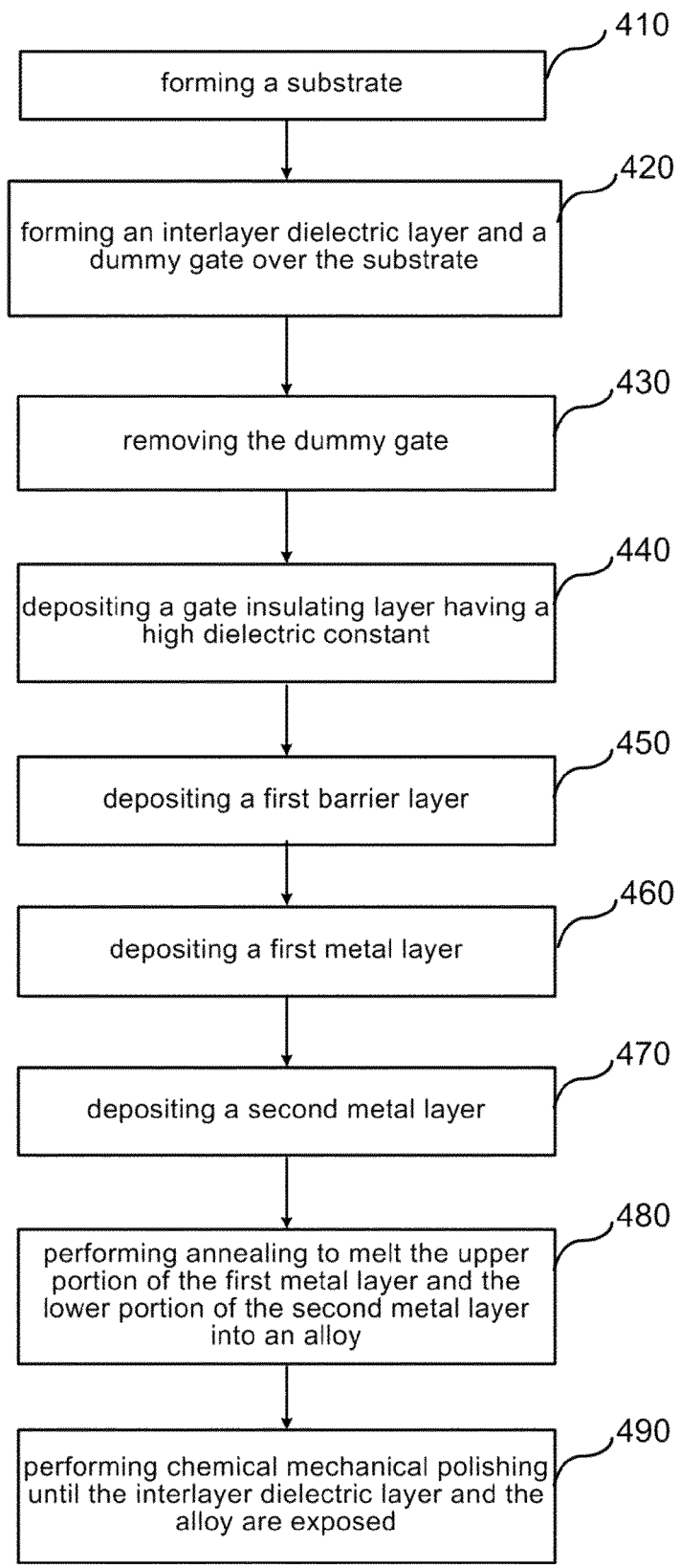
FIG. 4 is a flowchart of a method for manufacturing a semiconductor device according to an embodiment of the present disclosure.

FIG. 4 is a flowchart illustrating a method for manufacturing a semiconductor device according to an embodiment of the present disclosure.

As shown in FIG. 4, in step 410, a substrate is formed. The substrate may comprise a Si, SiGe, or SOI substrate.

Then, in step 420, an interlayer dielectric layer and a dummy gate embedded in the interlayer dielectric layer are formed over the substrate.

Then, in step 430, the dummy gate is removed to form a recess in the interlayer dielectric layer.

Next, in step 440, a gate insulating layer having a high dielectric constant (e.g., greater than 10) is deposited over the interlayer dielectric layer and the substrate.

Next, in step 450, a first barrier layer is deposited on the gate insulating layer.

Then, in step 460, a first metal layer is deposited on the first barrier layer.

Thereafter, in step 470, a second metal layer is deposited on the first metal layer.

Thereafter, in step 480, annealing is performed to melt the upper portion of the first metal layer and the lower portion of the second metal layer into an alloy.

In step 490, chemical mechanical polishing is performed until the interlayer dielectric layer and the alloy are exposed. As a result, the high-k metal gate of the semiconductor device according to the present disclosure consists of the alloy instead of pure aluminum.

Specific embodiments of the present invention will be described in detail below.

First Embodiment

FIGS. 1A-1G are schematic cross-sectional views of a semiconductor device at various steps during manufacturing according to the first embodiment of the present disclosure.

Figure 1A:
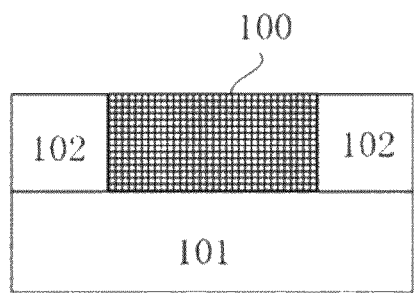
FIGS. 1A-1G are schematic cross-sectional views of a semiconductor device at various steps during manufacturing according to a first embodiment of the present disclosure.

First, in FIG. 1A, a dummy gate 100 is formed over a substrate 101, and then source/drain regions (not shown) are formed in the substrate 101. The substrate 101 may be, for example, a silicon substrate. The dummy gate may comprise, for example, polysilicon. The source/drain regions may be formed with implantation. Thereafter, a dielectric interlayer (ILD) 102 is formed above the substrate and is planarized to expose the dummy gate, as shown in FIG. 1A.

Figure 1B:
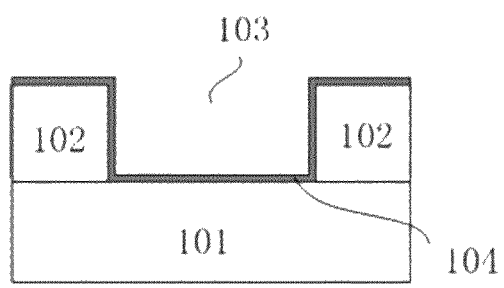

Next, as shown in FIG. 1B, the dummy gate 100 is removed to form a recess 103 in the ILD layer 102, and then a material having a high dielectric constant (e.g., greater than 10) is deposited as a gate insulating layer in the recess 103. The gate insulating layer 104 comprises a high-k material, for example, hafnium oxide, zirconium oxide, aluminum oxide, aluminum nitride, titanium oxide, lanthanum oxide, yttrium oxide, gadolinium oxide, tantalum oxide or any combination thereof. The gate insulating layer 104 may be deposited by CVD, PVD, PECVD, HDP-CVD, SACVD (or HARP), ALD, Epi, or e-plating.

Figure 1C:
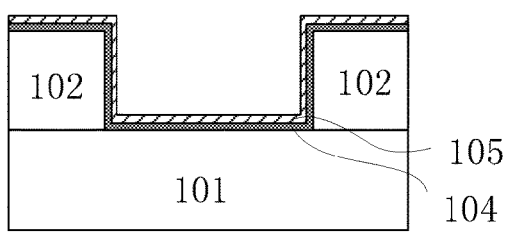

Then, as shown in FIG. 1C, a barrier layer 105 is deposited on the gate insulating layer 104. The barrier layer 105 may prevent materials to be formed thereon subsequently from diffusing into the gate insulating layer 104. The barrier layer 105 may comprise, for example, TiN, TaN, or a combination. The barrier layer 105 may be deposited by CVD, physical vapour deposition (PVD), PECVD, HDP-CVD, SACVD (or HARP), ALD, Epi, or e-plating.

Figure 1D:
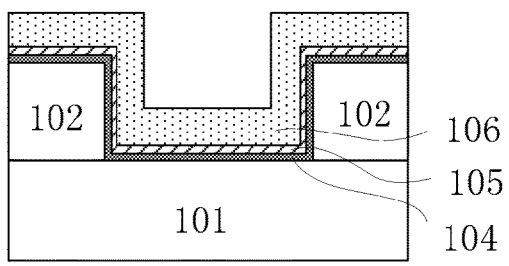

Then, as shown in FIG. 1D, a metal layer 106 is deposited on the barrier layer 105. The metal layer 106 constitutes an aluminum alloy. The metal layer 106 comprises any metal which can constitute aluminum alloy, for example, titanium aluminum (AlTi). The metal layer 106 may be deposited by CVD, PVD, PECVD, HDP-CVD, SACVD (or HARP), ALD, Epi, or e-plating.

Figure 1E:
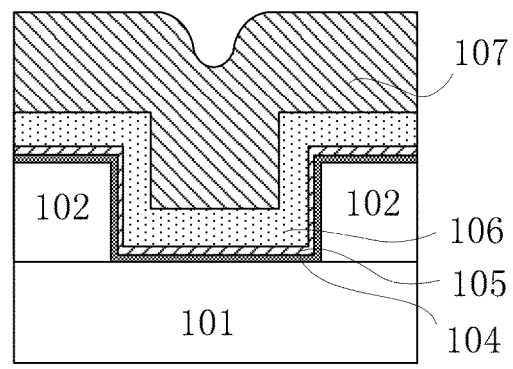

Then, as shown in FIG. 1E, a layer 107 of aluminum is deposited on the metal layer 106. The aluminum layer 107 may be deposited by CVD, PVD or the like.

Figure 1F:
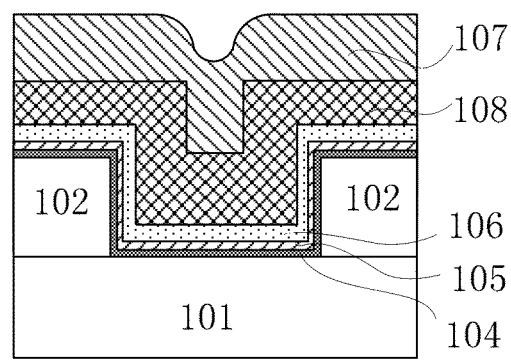

Next, as shown in FIG. 1F, anneal is performed to melt the upper portion of metal layer 106 and the lower portion of the aluminum layer 107 into a layer 108 of aluminum alloy. The lowest point of the top surface of the aluminum alloy layer 108 is not lower than the expected final height of the metal gate. In another embodiment, the entire metal layer 106 may constitute the aluminum alloy with the aluminum layer 107 after annealing.

Figure 1G:
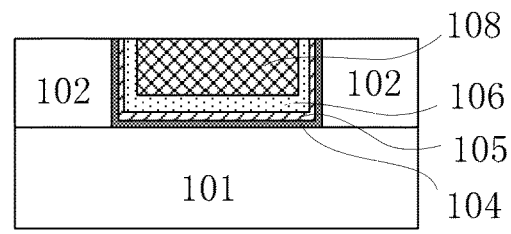

Next, as shown in FIG. 1G, CMP is performed until the ILD layer 102 is exposed. That is, all materials that are deposited above the ILD layer 102 are removed by the CMP, and after the CMP, the top surface of the metal gate is aluminum alloy, which will result in fewer defects in the metal gate due to the CMP.

Figure 2A:
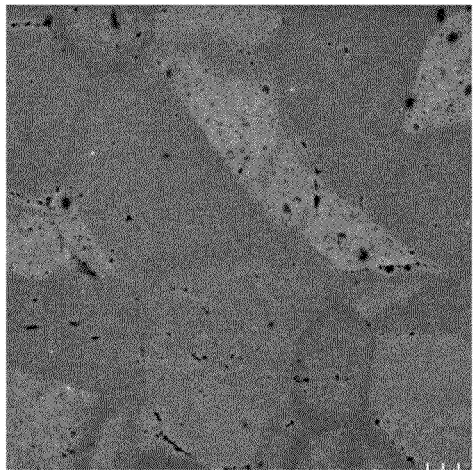
FIGS. 2A and 2B respectively show top surfaces of aluminum and AlTi alloy observed through a scanning electron microscope (SEM) after the CMP.
Figure 2B:
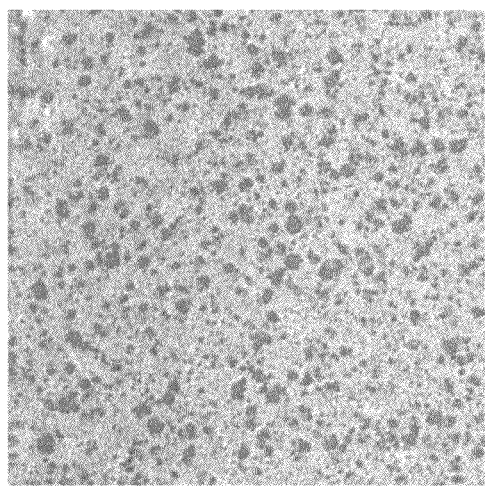

FIGS. 2A and 2B respectively show surfaces of aluminum (FIG. 2A) and AlTi alloy (FIG. 2B) observed through a scanning electron microscope (SEM) after a typical CMP. FIG. 2A shows aluminum surface after the CMP and FIG. 2B shows AlTi alloy surface after the CMP. It can be clearly seen from FIGS. 2A and 2B that, aluminum has bigger grain size and weaker grain boundary than AlTi alloy does. Furthermore, it is also apparent that there exists many defects in the aluminum surface after the CMP, and the AlTi alloy surface after the CMP has reduced defects as compared with the aluminum surface.

Second Embodiment

In order to improve performance of a semiconductor device by obtaining a work function value desirable for the semiconductor device, a layer of work function metal may be additionally formed between the gate insulating layer and the gate metal layer.

Figure 5A:
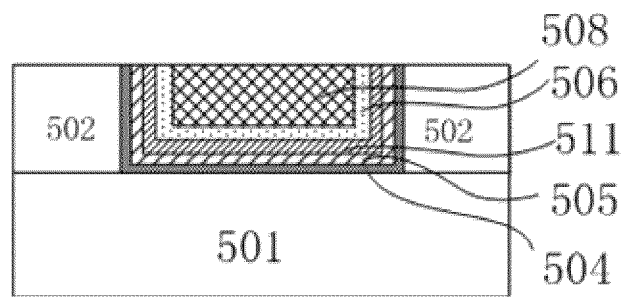
FIGS. 5A and 5B are schematic cross-sectional views of two kinds of semiconductor devices according to a second embodiment of the present disclosure.
Figure 5B:
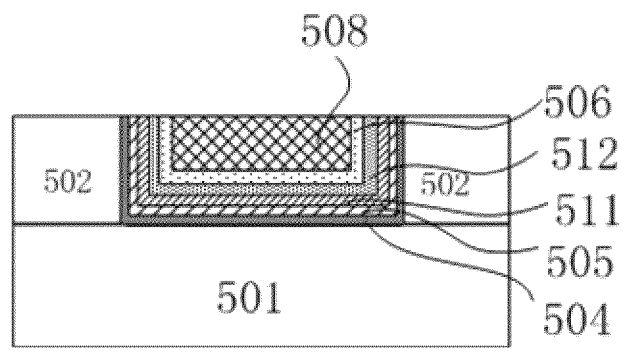

The semiconductor device according to the second embodiment is almost the same as that of the first embodiment, except that a layer of work function metal 511 is further provided between the barrier layer 505 and the metal layer 506, as shown in FIG. 5A. Further, as shown in FIG. 5B, another barrier layer 512 may be formed between the work function metal layer 511 and the metal layer 506 if needed, so as to avoid influence of subsequent metal layers on the work function metal layer 511. That is, in the second embodiment, after the barrier layer 505 is deposited and before the metal layer 506 is deposited, a work function metal layer 511 is deposited on the barrier layer 505, and optionally another barrier layer 512 is deposited on the work function metal layer. The work function metal layer 511 may comprise materials having desirable work function values, for example, TiAl alloy, TaC, TaCNO, TaCN, TaN and the like. The work function metal layer 511 may be deposited by CVD, PVD or the like. Another barrier layer 512 may comprise, for example, TiN, and may be deposited by CVD, PVD or the like. Reference numbers 501, 502, 504, 505, 506 and 508 in FIGS. 5A and 5B correspond to the substrate 101, the ILD 102, the gate insulating layer 104, the barrier layer 105, the metal layer 106 and the alloy layer 108 in the first embodiment, respectively, and thus, their detailed description is omitted here.

For NMOS devices, it is preferable that a work function metal layer formed of, for example, TiAl alloy is deposited on the barrier layer 505 before the metal layer 506 is deposited, and another barrier layer formed of, for example, TiN is deposited on the work function metal layer. For PMOS devices, it is preferable that, a work function metal layer formed of, for example, TiN is deposited on the barrier layer 505 after the barrier layer 505 is deposited and before the metal layer 506 is deposited, and there is no need to form another barrier layer.

EXAMPLE 1

Next, a semiconductor device and a corresponding manufacturing method according to one embodiment of the present disclosure will be described in detail in the case that AlTi alloy is used for the metal gate.

FIGS. 3A-3H are schematic cross-sectional views of a semiconductor device at various steps in a manufacturing method according to Example 1 of the present disclosure.

Figure 3A:
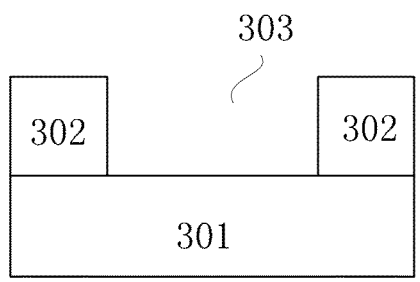
FIGS. 3A-3H are schematic cross-sectional views of a semiconductor device at various steps during manufacturing according to Example 1 of the present disclosure.

Like the first embodiment, an ILD layer 302 and a polysilicon dummy gate embedded in the ILD layer 302 are formed on a silicon substrate 301. At this point, source/drain regions have been formed in the silicon substrate 301. These processes are not shown in the figure. The polysilicon dummy gate is then removed to form a recess 303 in the ILD layer 302, as shown in FIG. 3A.

Figure 3B:
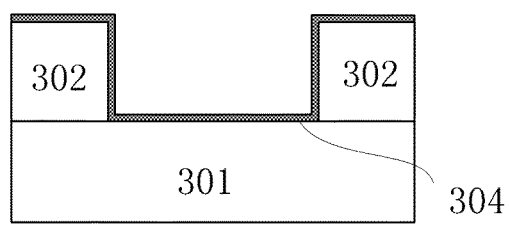
Figure 3C:
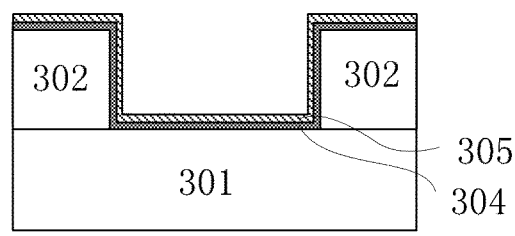
Figure 3D:
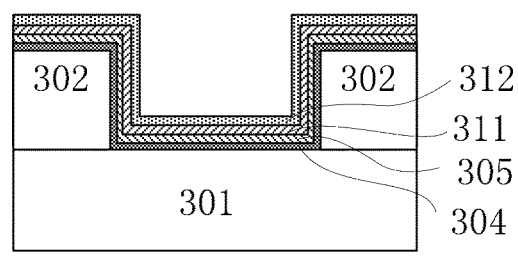
Figure 3E:
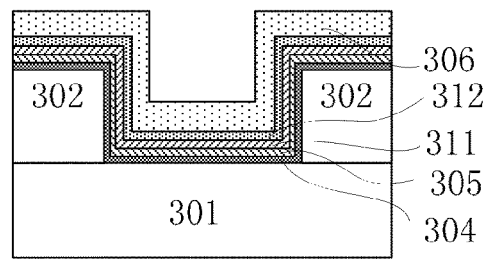
Figure 3F:
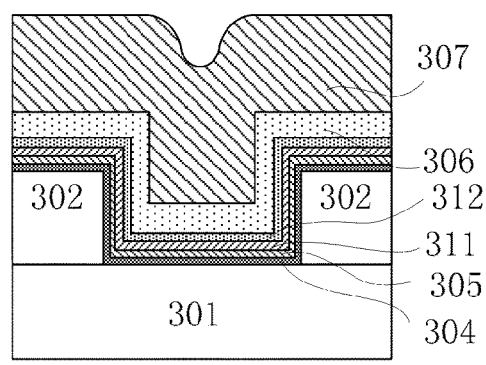
Figure 3G:
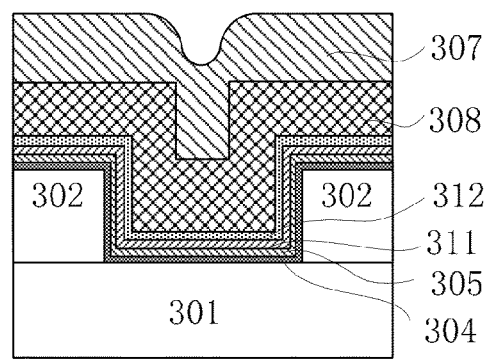
Figure 3H:
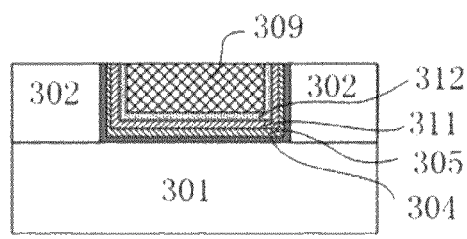

Then, as shown in FIG. 3B, a high k material such as HfO2 is deposited to form a gate insulating layer 304 in the recess 303. The gate insulating layer has a thickness in a range of 10 Å to 30 Å thick. Then, as shown in FIG. 3C, a TiN layer of 10 Å to 50 Å thick and a TaN layer of 5 Å to 15 Å thick are deposited in sequence on the gate insulating layer 304. The stack of the TiN layer and the TaN layer constitutes the first barrier layer 305. Then, as shown in FIG. 3D, TiAl alloy is deposited on the first barrier layer 305 by performing a PVD, to form a work function metal layer 311 in the range of 40 Å to 120 Å thick, and TiN is deposited again on the work function metal layer 311, to form a second barrier layer 312 in the range of 10 Å to 50 Å thick. Next, as shown in FIG. 3E, a Ti layer 306 is deposited on the second barrier layer 312 by performing a PVD. The Ti layer 306 may have a thickness ranging from 50 Å to 100 Å. Excessively thick Ti layer 306 is undesirable, because it may affect the hole filling of the aluminum layer to be deposited later. Then, as shown in FIG. 3F, a layer 307 of pure aluminum is deposited on the Ti layer 306 at a temperature ranging from 380° C. to 460° C. by performing a deposition process such as PVD. Thereafter, in FIG. 3G, an annealing process is performed at a temperature ranging from 300° C. to 460° C. for 1 to 3 minutes, to form an AlTi alloy layer 308 by the entire Ti layer 306 and the lower portion of the aluminum layer 307. The lowest point of the surface of the AlTi alloy layer 308 in the trench is not lower than the expected final height of the metal gate. Then, as shown in FIG. 3H, CMP is performed to remove all materials deposited on the ILD layer 302 and to obtain the desired height of the metal gate 309. The AlTi alloy forms the final surface of metal gate 309 after CMP. The final thickness of gate 309 (that is, the height from the top surface of the gate insulating layer 304 to the top surface of the gate 309 including the work function layers after CMP) is in the range of 300 Å to 400 Å. The thickness of the AlTi alloy layer 309 after CMP is 250 Å to 300 Å (without the work function layers). Consequently, the high-k metal gate surface after CMP is aluminum alloy rather than pure aluminum defects in the metal gate 309 are reduced. Thus, the reliability of the semiconductor device is improved.

Further, the AlTi alloy layer discussed above has been analyzed with Auger spectroscopic analysis. In an experiment, a Ti layer of about 80 Å thick and an Al layer of about 4000 Å thick are deposited on a Si substrate having an oxide layer of about 8500 Å thick formed thereon. After an annealing is performed, the whole Ti layer and the lower portion of the Al layer formed an AlTi alloy. Then, CMP is performed to remove most of the remaining Al layer. The thickness of the AlTi alloy layer is determined by etching the layer obtained after the CMP and analyzing its surface composition in an Auger analysis. It was determined that the thickness of the AlTi alloy layer is 250 Å to 300 Å. Since the full stack height of the metal gate required in the device (the height from the top surface of the gate insulating layer 304 to the top surface of the gate after CMP in FIG. 3H) is 300 Å to 400 Å, the AlTi alloy layer in the thickness of 250 Å to 300 Å is sufficient to ensure that the final surface of the metal gate after CMP is AlTi alloy which is resistant to chemical corrosion and mechanical damage.

To sum up, as described above, in the case of the semiconductor device and the manufacturing method according to the present disclosure, by using Al alloy for the final metal gate material, metal gate defects can be reduced and therefore reliability of the device can be improved.

Although this disclosure have been described in detail by way of exemplary embodiments, it should be understood by a person skilled in the art that the above exemplary embodiments are merely illustrative and are not intended to limit the scope of this disclosure. It should be understood by a person skilled in the art that the above embodiments can be modified without departing from the scope and spirit of this disclosure. The scope of this disclosure is defined by the appended claims.

What is claimed is:
1. A method for manufacturing a semiconductor device, comprising:
   forming a substrate;
   forming an interlayer dielectric layer on the substrate and a dummy gate embedded in the interlayer dielectric layer;
   removing the dummy gate to form a recess in the interlayer dielectric layer;

depositing a gate insulating layer having a high dielectric constant over the interlayer dielectric layer and the substrate;

depositing a first barrier layer on the gate insulating layer;

depositing a first metal layer on the first barrier layer;

depositing a second metal layer on the first metal layer;

performing annealing to melt an upper portion of the first metal layer and a lower portion of the second metal layer into an alloy; and performing chemical mechanical polishing until the interlayer dielectric layer and the alloy are exposed.

2. The method according to claim 1, wherein the first metal layer comprises titanium, indium, or gallium.

3. The method according to claim 1, wherein the second metal layer comprises aluminum or tungsten.

4. The method according to claim 1, after the step of depositing the first barrier layer and before the step of depositing the first metal layer, further comprising:

depositing a work function metal layer on the first barrier layer.

5. The method according to claim 4, after the step of depositing the work function metal layer and before the step of depositing the first metal layer, further comprising:

depositing a second barrier layer on the work function metal layer.

6. The method according to claim 5, wherein the work function metal layer is a TiAl alloy layer having a thickness in a range of 40 Å to 120 Å, and the second barrier layer is a TiN barrier layer having a thickness in a range of 10 Å to 50 Å.

7. The method according to claim 1, wherein the gate insulating layer is a hafnium oxide layer having a thickness in a range of 10 Å to 30 Å.

8. The method according to claim 1, wherein the step of depositing a first barrier layer comprises: depositing a TiN layer and sequentially depositing a TaN layer on the TiN layer, the TiN layer having a thickness in a range of 10 Å to 50 Å and the TaN layer having a thickness in a range of 5 Å to 15 Å.

9. The method according to claim 1, wherein the annealing is performed at a temperature from 300° C. to 460° C.

10. The method according to claim 1, wherein the alloy is an AlTi alloy.

11. The method according to claim 10, wherein the alloy has a thickness in a range of 250 Å to 300 Å after a chemical mechanical polishing process.

\* \* \* \* \*